United States Patent
Joseph Varghese et al.

(10) Patent No.: US 11,688,632 B2
(45) Date of Patent: Jun. 27, 2023

(54) SEMICONDUCTOR DEVICE WITH LINERLESS CONTACTS

(71) Applicant: INTERNATIONAL BUSINESS MACHINES CORPORATION, Armonk, NY (US)

(72) Inventors: Alex Joseph Varghese, Ballston Lake, NY (US); Marc A. Bergendahl, Rensselaer, NY (US); Andrew M. Greene, Slingerlands, NY (US); Dallas Lea, Niskayuna, NY (US); Matthew T. Shoudy, Guilderland, NY (US); Yann Mignot, Slingerlands, NY (US); Ekmini A. De Silva, Slingerlands, NY (US); Gangadhara Raja Muthinti, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 255 days.

(21) Appl. No.: 17/136,595

(22) Filed: Dec. 29, 2020

(65) Prior Publication Data
US 2021/0151351 A1    May 20, 2021

Related U.S. Application Data

(62) Division of application No. 16/359,442, filed on Mar. 20, 2019, now Pat. No. 10,903,111.

(51) Int. Cl.
*H01L 23/48*    (2006.01)
*H01L 23/52*    (2006.01)
(Continued)

(52) U.S. Cl.
CPC .... *H01L 21/76829* (2013.01); *H01L 21/7682* (2013.01); *H01L 21/7688* (2013.01); *H01L 21/76805* (2013.01); *H01L 21/76844* (2013.01)

(58) Field of Classification Search
CPC ......... H01L 21/76829; H01L 21/76805; H01L 21/7682; H01L 21/76844; H01L 21/7688;
(Continued)

(56) References Cited

U.S. PATENT DOCUMENTS

| 5,933,753 A | 8/1999 | Simon et al. |
| 6,391,785 B1 | 5/2002 | Satta et al. |

(Continued)

OTHER PUBLICATIONS

List of IBM Patents or Patent Applications Treated as Related dated Dec. 29, 2020, 2 pages.

(Continued)

*Primary Examiner* — Theresa T Doan
(74) *Attorney, Agent, or Firm* — Tutunjian & Bitetto, P.C.; Samuel Waldbaum

(57) ABSTRACT

Semiconductor devices and methods for forming semiconductor devices include opening at least one contact via through a sacrificial material down to contacts. Sides of the at least one contact via are lined by selectively depositing a barrier on the sacrificial material, the barrier extending along sidewalls of the at least one contact via from a top surface of the sacrificial material down to a bottom surface of the sacrificial material proximal to the contacts such that the contacts remain exposed. A conductive material is deposited in the at least one contact via down to the contacts to form stacked contacts having the hard mask on sides thereof. The sacrificial material is removed.

18 Claims, 11 Drawing Sheets

(51) Int. Cl.
*H01L 29/40* (2006.01)
*H01L 21/768* (2006.01)

(58) Field of Classification Search
CPC ......... H01L 21/76831; H01L 21/76834; H01L 21/76885; H01L 21/76897
USPC ........................................................ 257/758
See application file for complete search history.

(56) References Cited

U.S. PATENT DOCUMENTS

| | | | |
|---|---|---|---|
| 6,607,977 | B1 | 8/2003 | Rozbicki et al. |
| 6,939,801 | B2 | 9/2005 | Chung et al. |
| 7,694,413 | B2 | 4/2010 | Johnston et al. |
| 8,232,618 | B2 | 7/2012 | Breyta et al. |
| 8,361,900 | B2 | 1/2013 | Pan et al. |
| 8,471,343 | B2 | 6/2013 | Doris et al. |
| 8,614,107 | B2 | 12/2013 | Lavoie et al. |
| 9,362,355 | B1 | 6/2016 | Cheng et al. |
| 9,484,250 | B2 | 11/2016 | Leobandung |
| 9,666,533 | B1 * | 5/2017 | Basker .................. H01L 23/485 |
| 9,761,698 | B2 | 9/2017 | Leobandung |
| 9,768,118 | B1 | 9/2017 | Li et al. |
| 9,837,309 | B2 | 12/2017 | Clevenger et al. |
| 9,871,121 | B2 | 1/2018 | Xu et al. |
| 2003/0068894 | A1 | 4/2003 | Iggulden et al. |
| 2009/0166867 | A1 | 7/2009 | Simka et al. |
| 2014/0077379 | A1 | 3/2014 | Dirk et al. |
| 2016/0163645 | A1 | 6/2016 | Kamineni et al. |
| 2017/0005037 | A1 | 1/2017 | Liang et al. |
| 2017/0317212 | A1 | 11/2017 | Kim |

OTHER PUBLICATIONS

Mameli, "Area-Selective Atomic Layer Deposition of SiO2 Using Acetylacetone as a Chemoselective Inhibitor in an ABC-Type Cycle", ACS Nano 2017, vol. 11, Aug. 2017, pp. 9303-9311.

Mameli, "Area-Selective Atomic Layer Deposition of In2O3:H using a u-Plasma Printer for Local Area Activation", Chen. Mater. 2017, vol. 29, Jan. 2017, pp. 991-925.

Fan, "Middle of Line RC Performance Study at the 7 nm Node", IEEE International Interconnect Technology Conference, May 2017, 3 pages.

Anonymous, "Process for Forming CMOS Airgap Spacer Via Contact Liner Etch", IP.com Prior Art Database Technical Disclosure, Oct. 2018, 3 pages.

* cited by examiner

SEMICONDUCTOR DEVICE WITH LINERLESS CONTACTS

BACKGROUND

The present invention generally relates to linerless contacts in semiconductor devices, and more particularly to semiconductor devices having stacked contacts without a liner for having metal-to-metal contact interfaces.

Liners around contacts can improve isolation between regions of a device. However, liners also impair current transfer between stacked contacts, as well as any other contacts through which current is intended to flow. The liner in such cases adds resistances to the current flow. The resistance decreases the efficiency of device operation, resulting in greater power draw and reduced switching performances.

SUMMARY

In accordance with an embodiment of the present invention, a method for forming stacked contacts on a semiconductor device is presented. The method includes opening at least one contact via through a sacrificial material down to contacts. Sides of the at least one contact via are lined by selectively depositing a barrier on the sacrificial material, the barrier extending along sidewalls of the at least one contact via from a top surface of the sacrificial material down to a bottom surface of the sacrificial material proximal to the contacts such that the contacts remain exposed. A conductive material is deposited in the at least one contact via down to the contacts to form stacked contacts having the hard mask on sides thereof. The sacrificial material is removed.

In accordance with an embodiment of the present invention, a method for forming stacked contacts on a semiconductor device is presented. The method includes forming sacrificial material over the semiconductor device. A mask is patterned over the sacrificial material. At least one contact via is opened through the sacrificial material down to contacts according to the mask. Sides of the at least one contact via are lined by selectively depositing a barrier on the sacrificial material, the barrier extending along sidewalls of the at least one contact via from a top surface of the sacrificial material down to a bottom surface of the sacrificial material proximal to the contacts such that the contacts remain exposed. A conductive material is deposited in the at least one contact via down to the contacts to form stacked contacts having the hard mask on sides thereof. The sacrificial material is removed and an interlevel dielectric is formed around the stacked contacts.

In accordance with another embodiment of the present invention, a semiconductor device with stacked contacts is presented. The semiconductor includes a device layer with device components. The device components include a gate structure disposed on a substrate including a gate conductor, a source/drain region on each of opposing sides of the gate structure and a trench contact contacting each of the source/drain regions. A stacked contact layer including at least one stacked contact in metal-to-metal contact with at least one of the device components and having a hard mask on sides of the at least one stacked contact.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
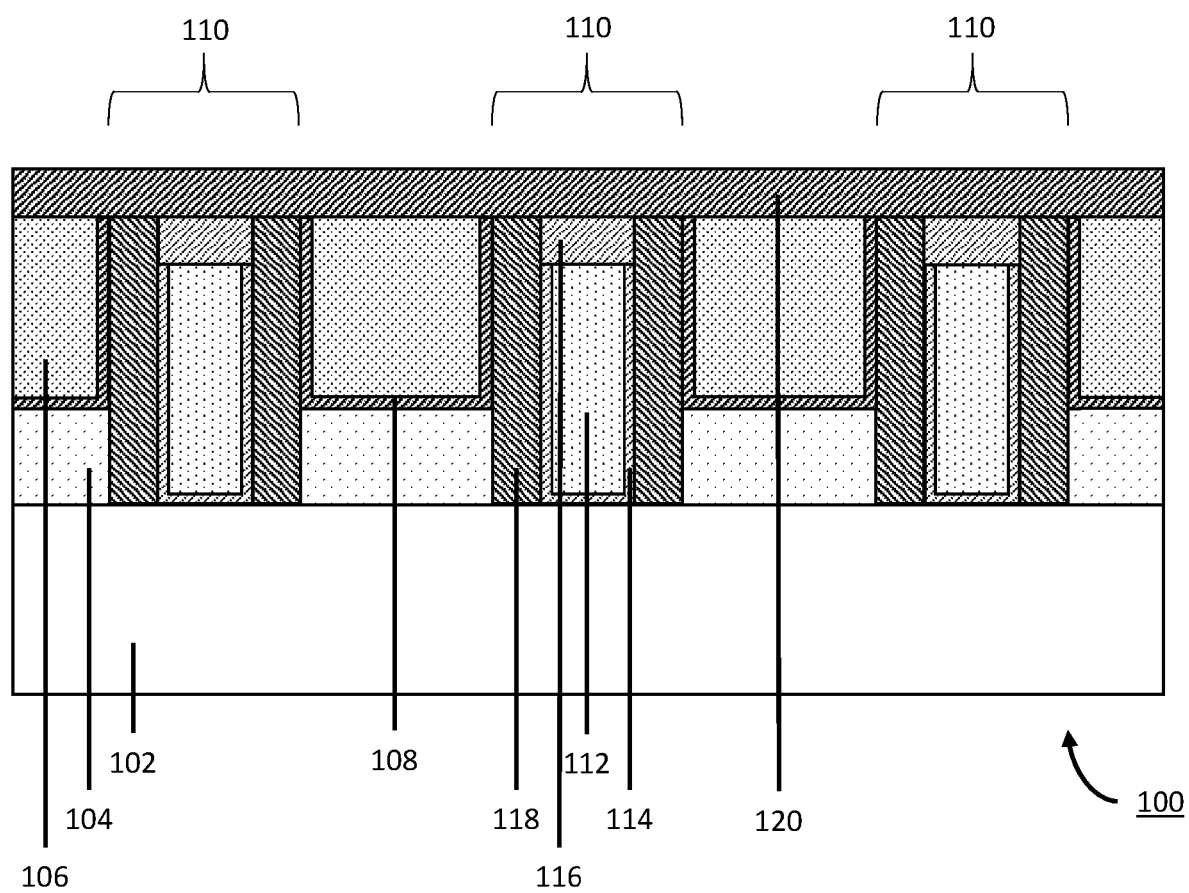
FIG. 1 is a cross-sectional view showing a semiconductor device with gate structures on a substrate, in accordance with an embodiment of the present invention.

According to an embodiment of the present invention, contacts are stacked over structures of a semiconductor device such that the contacts have a metal-to-metal interface with the device structures.

A sacrificial layer is formed over the semiconductor device. Contact vias are patterned into the sacrificial layer down to contacts of the semiconductor device according to a patterned mask. The contact vias are lined by selectively depositing a barrier material on the sacrificial layer. Selective deposition formed the barrier material on surfaces of the sacrificial layer, such as, e.g., interior walls of the contact vias while avoid forming a hard mask layer on, e.g., conductive materials such as contacts within the semiconductor device at bottoms of the contact vias.

The contact vias are filled with a conductive material to form stacked contacts over the semiconductor device. Because of the selective deposition of the hard mask on the sacrificial layer, the stacked contacts are formed with a metal-to-metal interface with the preexisting contacts within the semiconductor device. The sacrificial layer can be removed and replaced with an isolation material to isolate the stacked contacts from each other. Thus, current can be supplied through the stacked contacts without interference by a liner/barrier layer reducing resistance due to the metal-to-metal interface. Thus, the semiconductor device can be operated with reduced power draw and improved switching performance.

Exemplary applications/uses to which the present invention can be applied include, but are not limited to: contacts in semiconductor manufacturing, such as, e.g., stacked contacts over transistor devices.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view showing a semiconductor device with gate structures on a substrate is depicted according to an embodiment of the present invention.

According to an embodiment of the present invention, a semiconductor device 100 is provided on with a substrate 102. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

Structures, such as, e.g., gate structures 110, are formed on the substrate 102. The gate structures 110 can form transistors, such as, e.g., field-effect transistors (FET). According to one possible embodiment, the gate structures 110 corresponding to fin-type FETs (fin FETs).

The gate structures 110 can be formed using deposition, photolithography and a selective etching process. In one embodiment, a gate last process is used to pattern a gate replacement structure on the substrate 102. Spacers 118 can then be formed on opposing sides the gate replacement structure by, e.g., conformal deposition of a spacer material, such as oxides, nitrides or oxynitrides, among other dielectric materials. The spacer material is then anisotropically removed by an etch process that removes the conformal layer from all of the surfaces of the replacement gate structure and any other device 100 structures except for the sidewalls of the replacement gate structure to form vertical sidewall spacers 118. The gate replacement structure is then replaced with a gate dielectric 114, gate conductor 112 and gate cap 116. However, a gate first process can also be used in which the gate dielectric 114, gate conductor 112 and gate cap 116 of the gate structure 110 is formed first, and then the spacers 118 are formed on opposing sides thereof.

Next, gate dielectric 114 is formed within the gate structure 110 utilizing, e.g., a deposition process. Alternatively, gate dielectric 114 may be formed by a thermal oxidation, nitridation or oxynitridation process. Combinations of the aforementioned processes may also be used in forming the gate dielectric 114. The gate dielectric may be composed of any conventional dielectric including, but not limited to: $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides. Gate dielectric 114 may also include any combination of the aforementioned dielectric materials.

After gate dielectric 114 has been formed, the gate conductor 112 is formed within a cavity defined by the gate dielectric 114 between the spacers 118 using, e.g., a deposition process (such as CVD, plasma-assisted CVD, plating, sputtering and etc.) followed by planarization. Gate conductor 112 may include any conductive material including but not limited to: polysilicon; a conductive elemental metal such as W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof may be employed. When a combination of conductive elements is employed, an optional diffusion barrier material such as TaN or WN may be formed between the conductive materials.

In one embodiment, a contact cap (hereafter referred to as a dielectric cap 116) may be used to complete each of the gate structures 110. The dielectric cap 116 may be formed by first depositing a dielectric hard mask material, like SiN or $SiO_2$, atop each gate conductor 112 using, e.g., a deposition process and planarization. The dielectric cap 116 may be removed by a wet or dry etch prior to the silicidation process. Alternatively, the gate structures 110 can be formed by other patterning techniques such as spacer image transfer.

Source/drain regions 104 can be formed on opposing sides of each gate structure 110, for example, abutting the spacers 118, using, e.g., epitaxial growth of a conductive material. The source/drain regions 104 include, e.g., a silicon containing material, such as silicon, silicon germanium, or silicon doped with carbon (Si:C). The material of the source/drain regions 104 can be doped via ion implantation for p-type doping or n-type doping of the source/drain regions 104. However, in another possible embodiment, the source/drain regions 104 can be formed by forming an insitu doped material on the exposed portions of fin structures using epitaxy. Other conductive materials are also contemplated.

Contacts 106 are formed on the source/drain regions 104. The contacts 106 can include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

According to one possible embodiment, a contact liner 108 can be formed between the source/drain regions 104 and the contacts 106. The contact liner 108 can include, e.g., a dielectric The trenches may optionally be lined with a conventional liner material, e.g., an oxide, and then CVD or another like deposition process is used to fill the trench with polysilicon or another like STI dielectric material, including, e.g., a suitable dielectric including, e.g., an oxide or nitride. The STI dielectric may optionally be densified after deposition to form the contact liner 108. The contacts 106 can then be formed within the lined trench on the contact liner 108.

One or more capping layers 120 can be optionally deposited over the semiconductor device 100, including the gate structures 110 and the contacts 106. Such capping layer(s) 120 include a dielectric material to protect the contacts 106 and gate structures 110 from subsequent processing, such as, e.g., selective deposition as will be described below. For example, the capping layer(s) 120 can include, e.g., an oxide or a nitride, such as, silicon nitride (SiN), silicon dioxide (SiO$_2$), among other materials to the contacts 106 and gate structures 110.

Figure 2:
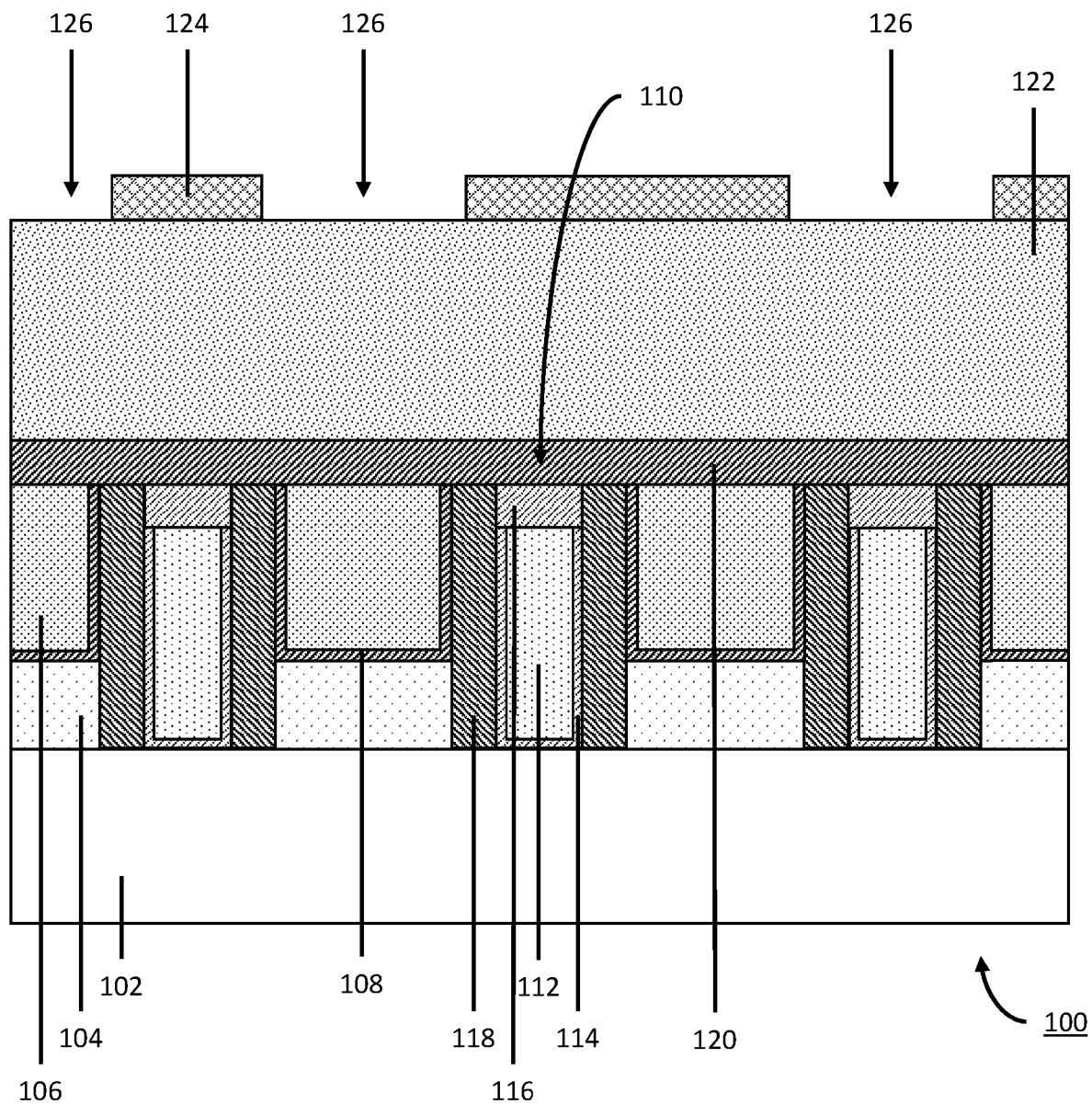
FIG. 2 is a cross-sectional view showing a sacrificial layer and mask formed over a semiconductor device with gate structures on a substrate, in accordance with an embodiment of the present invention.

Referring now to FIG. 2 is a cross-sectional view showing a sacrificial layer and mask formed over a semiconductor device with gate structures on a substrate is depicted according to an embodiment of the present invention.

A sacrificial layer 122 is formed over the semiconductor device 100. The sacrificial layer 122 can be later replaced. As a result, the sacrificial layer 122 can include a suitable material for processing and later removal, such as, amorphous silicon (α-Si). Amorphous silicon is a non-crystalline silicon that can be easily and cheaply deposited for use as a sacrificial layer 122. The sacrificial layer 122 can be formed by deposition, such as, e.g., chemical vapor deposition (CVD) or other suitable deposition process.

A mask 124 can be formed on the sacrificial layer 122. The mask 124 is patterned with openings 126 corresponding to contact locations. Specifically, a pattern is produced by applying a photoresist or photoresist stack to the surface of the mask 124; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions as well as the underlying portions of the mask 124 to form openings 126 down to the sacrificial layer 122.

Figure 3:
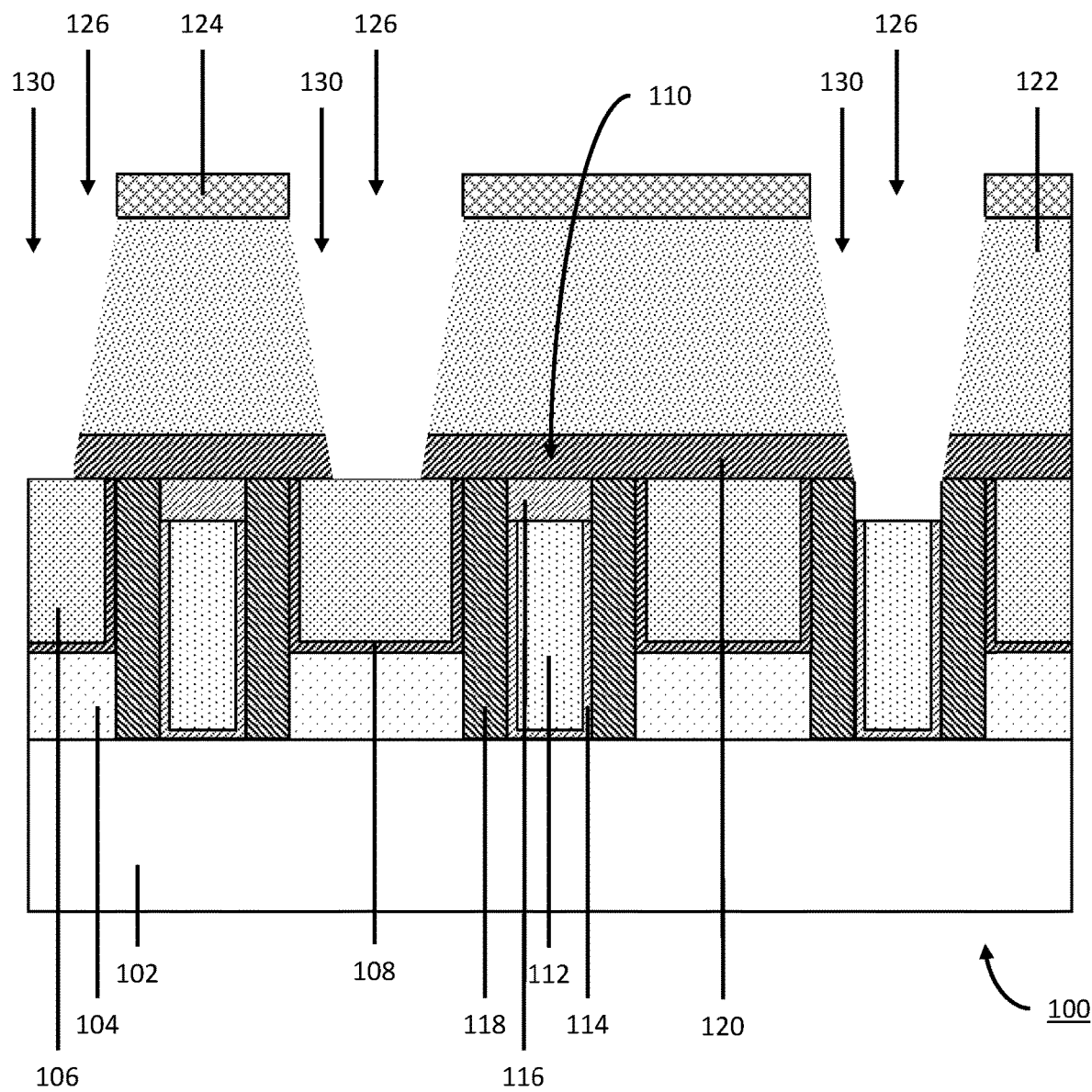
FIG. 3 is a cross-sectional view showing contact vias formed through a sacrificial layer over a semiconductor device with gate structures on a substrate, in accordance with an embodiment of the present invention.

Referring now to FIG. 3 is a cross-sectional view showing contact vias formed through a sacrificial layer over a semiconductor device with gate structures on a substrate is depicted according to an embodiment of the present invention.

Contact vias 130 are formed within the sacrificial layer 122 down to a device contact, such as, e.g., a contact 106, a gate conductor 112, or combinations thereof. As such, the contact vias 130 can be formed using a selective etch process, such as, reactive ion etching (RIE), or other suitable etch process. The etching is performed selective to the material of the mask 124, the contacts 106, gate conductor 112, gate spacers 118, as well as any other material for which etching is not desired. Thus, the contact via 130 is etched into the sacrificial layer 122 according to the pattern of the openings 126, including through the capping layer(s) 120.

As a result, material of the contacts 106 and/or the gate conductors 106 are exposed. The contact via 130, therefore, extends from a top surface of the sacrificial layer 122 down to a bottom surface of the sacrificial layer 122, adjacent to the capping layer(s) 120. The etch process can also be used to extend the contact via 130 through the capping layer(s) 120 to reach a conductive material, such as, e.g., the contacts 106 and/or the gate conductor 112. To reach the gate conductor 112, the contact via 130 is also etched through the dielectric cap 116. As a result, the etch process etches selective to the materials of the contacts 106 and the gate conductor 112. Also, to prevent damage to the spacers 118 when etching through the dielectric cap 116, the etching can be performed selective to the material of the spacers 118 as well.

The resulting contact via 130 exposes conductive material in locations of the device 100 where stacked contacts will be formed. The contact vias 130 can extend through the sacrificial layer 122 with side walls that are substantially perpendicular to the top and/or bottom surface of the sacrificial layer. However, the etch process may also result in the contact vias 130 having a tapered profile where the sidewalls are sloped to narrow the contact vias 103 towards the contacts 106 and gate conductors 112. Thus, the contact vias 130 can have a top opening at the top surface of the sacrificial layer 122 that is wider than a bottom opening at the contacts 106 and/or gate conductors 112.

The etching can be performed in a single etching step with a chemistry that is selective to each of the mask 124, the contacts 106, gate conductor 112 and gate spacers 118. Alternatively, multiple etch steps can be performed to etch the sacrificial layer 122 selective to other materials exposed at the corresponding step.

Figure 4:
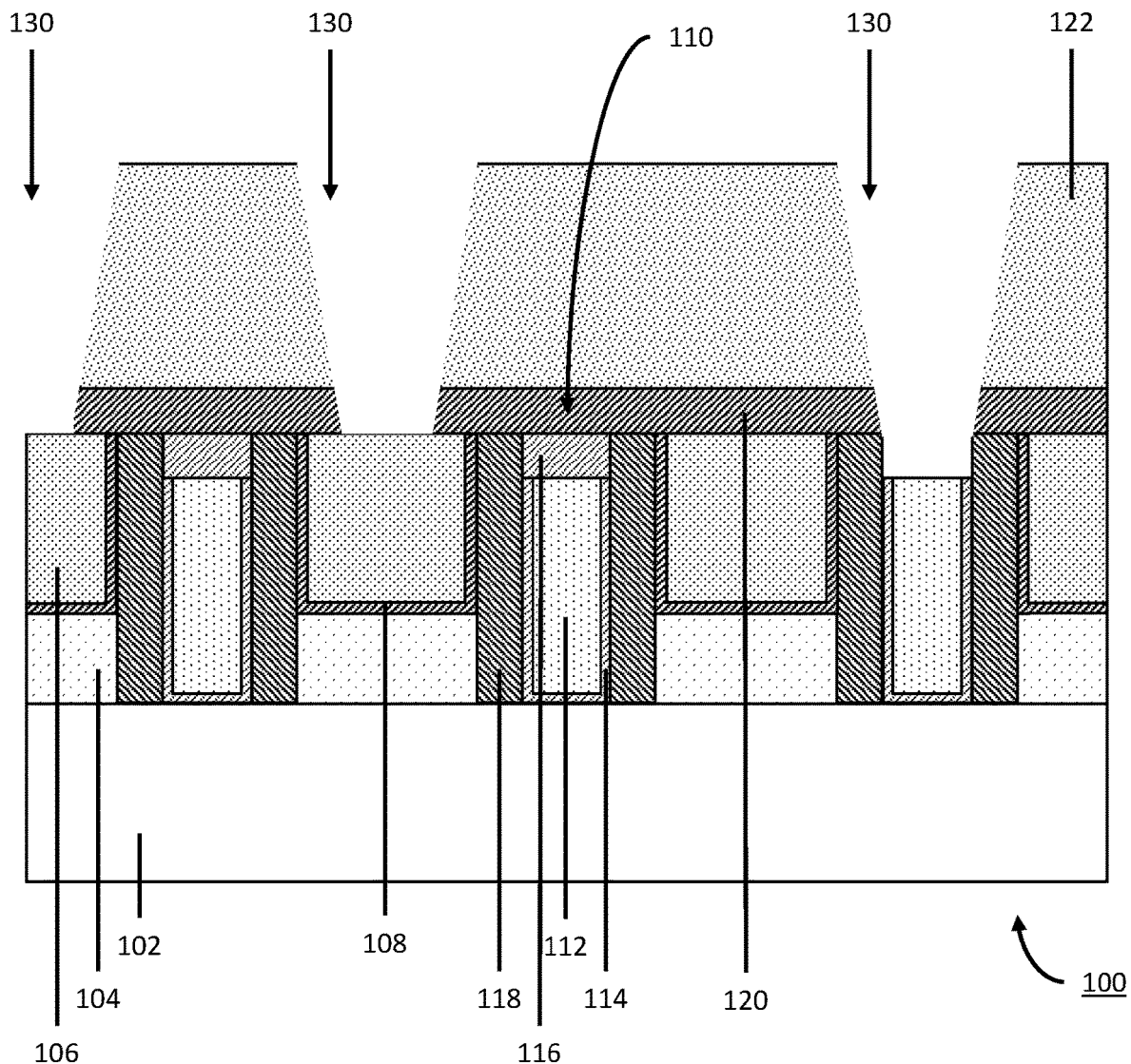
FIG. 4 is a cross-sectional view showing a hard mask corresponding to contact vias removed from over a semiconductor device with gate structures on a substrate, in accordance with an embodiment of the present invention.

Referring now to FIG. 4 is a cross-sectional view showing a hard mask corresponding to contact vias removed from over a semiconductor device with gate structures on a substrate is depicted according to an embodiment of the present invention.

Upon opening the contact vias 130, the mask 124 can be removed from the sacrificial layer 122. The mask 124 is removed using, e.g., a planarization, polishing or grinding step to provide a planar top surface of the sacrificial layer 122. According to one possible embodiment, the mask 124 is removed using, e.g., chemical mechanical planarization (CMP) to planarize material down to a planar surface of the sacrificial layer 122. In an alternate embodiment the mask 124 can be removed by chemical etching, wet or dry, to leave the 122 surface clear of residues.

Figure 5:
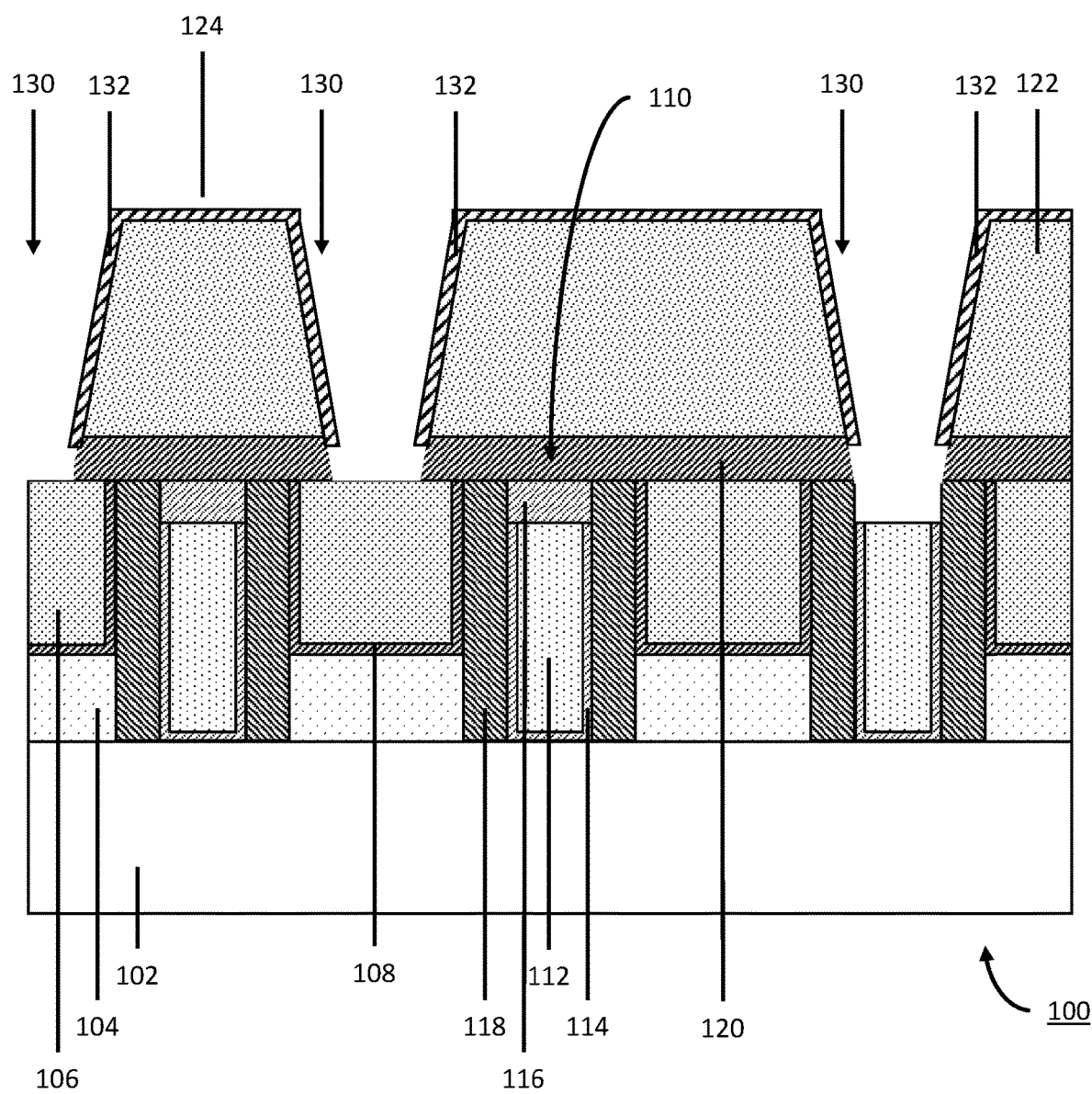
FIG. 5 is a cross-sectional view showing a sacrificial layer with contact vias lined with a selectively deposited barrier/liner over a semiconductor device with gate structures on a substrate, in accordance with an embodiment of the present invention.

Referring now to FIG. 5 is a cross-sectional view showing a sacrificial layer with contact vias lined with a barrier/liner over a semiconductor device with gate structures on a substrate is depicted according to an embodiment of the present invention.

According to an embodiment of the present invention, a barrier or liner 132 is used to line interior walls of the contact vias 130. However, the barrier 132 is formed to leave the contacts 106 and gate conductors 112 exposed. As a result, barrier 132 is selectively deposited on the sacrificial layer 122. The selective deposition of the barrier 132 is selective to the capping layer(s) 120 and the material of the contacts 106 and gate conductors 112. For example, the barrier 132 can be selectively deposited using, e.g., atomic layer deposition (ALD) to form a conformal layer of the barrier 132 material across the sacrificial layer 122.

As a result of the selective deposition process, the barrier 132 is formed on the sacrificial material 122, but not on any other material. For example, the deposition can be performed such that the barrier 132 is deposited on the sacrificial layer 122 but cannot be formed on the capping layer(s) 120, contacts 106, spacers 118, gate dielectric 114 or gate conductor 112. In particular, where the sacrificial layer 122 is made of amorphous silicon, the selective deposition is can be configured to only deposit the barrier 132 on amorphous silicon. However, the deposition of the barrier 132 can be selective to any combination of materials used in the device 100 such that the contact vias 130 are lined with the barrier 132 but conductive materials remain exposed. As a result, the selective deposition process can also include deposition on other materials of the device selective to conductive materials used in the contacts 106 and gate conductor 112. Thus, according to some embodiments, the barrier 132 can be deposited on the sacrificial layer 122 as well as the capping layer(s) 120 selective to the contacts 106 and gate conductor 112.

The barrier 132 forms a lining along the sides of the contact vias 130 with a uniform thickness on interior surfaces of the contact via 130 sidewalls due to, e.g., conformal deposition. Accordingly, the barrier 132 follows the profile of the contact vias 130. For example, the contact vias 130 can have a tapered cross section where a top opening of the contact via 130 at the top surface of the sacrificial layer 122 is wider than a bottom opening below the sacrificial layer 122 proximal to the device 100. The thickness of the barrier 132 can include any suitable thickness, such as, e.g., about 1 nanometer and below.

The barrier 132 can include a suitable diffusion barrier material for improving the isolation of subsequently formed contacts in the contact vias 130. As such, the barrier 132 can include a suitable selectively deposited dielectric, such as, an oxide, a nitride, an oxynitride among other compounds, including, e.g., $SiO_2$ or $Al_3N_4$, or alternatively high-k dielectrics such as oxides of Ti, Ta, Zr, Al or combinations thereof. According to one embodiment, the barrier 132 includes, e.g., titanium nitride (TiN).

While the barrier 132 is selectively deposited on the sacrificial layer 122, there can include overgrowth of the barrier 132 onto the capping layer(s) 120. The overgrowth results in the barrier 132 extending down past the bottom surface of the sacrificial layer 122 on sides of the capping layer(s) 120. However, the capping layer(s) 120 is of such a thickness as to prevent full overgrowth down to a conductive material, e.g., of the contacts 106 or the gate conductor 112. As a result, the capping layer(s) 120 limits the barrier 132 to a partial overgrowth, such that the barrier 132 stops short of the contacts 106 and gate conductors 112.

The overgrowth of the barrier 132 can result from isotropic growth of the barrier 132 material during selective deposition. As a result, as the barrier 132 is deposited, the barrier 132 grows in all directions, including a direction perpendicular to the thickness of the barrier 132 from the sides of the contact vias 130. Thus, the barrier 132 can grow during selective deposition over a portion of, e.g., the capping layer(s) 120 by growing perpendicular to the thickness of the barrier 132 and parallel to sidewalls of the contact vias 130, thus extending past the bottom surface of the sacrificial layer 122. However, the degree of overgrowth is limited by the thickness of the deposited barrier layer 132. Accordingly, the selective deposition can be such that overgrowth of the barrier 132 is limited to partial overgrowth onto the capping layer(s) 120 by limiting the thickness of the deposited material of the barrier 132. For example, the barrier 132 can be deposited to a thickness less than a thickness of the capping layer(s) 120. However, other methods of limiting overgrowth of the barrier 132 to the barrier 132 from extending down to the contacts 106 and the gate conductors 112 are contemplated.

Figure 6:
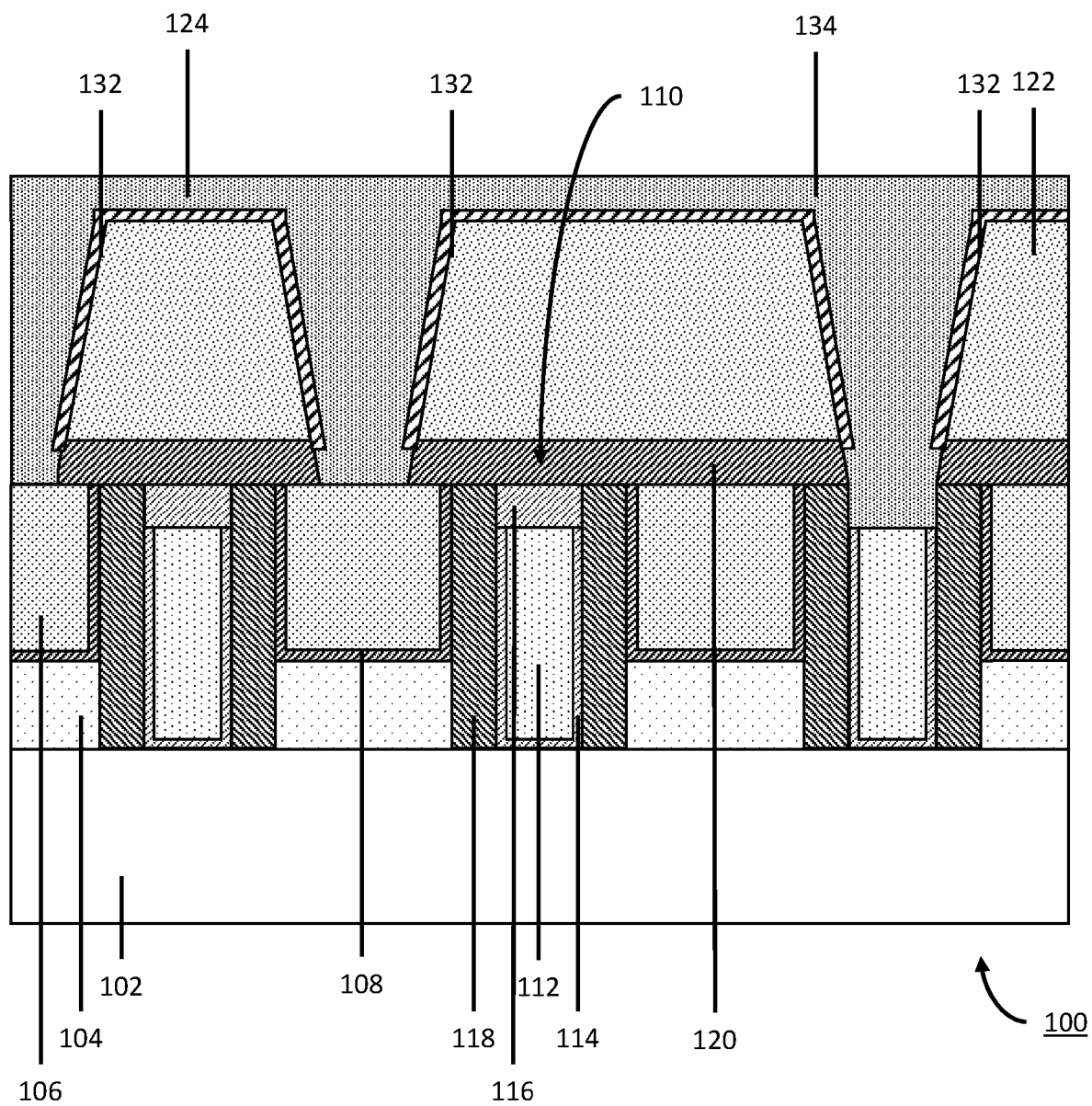
FIG. 6 is a cross-sectional view showing a conductive material deposited across a semiconductor device over gate structures on a substrate, in accordance with an embodiment of the present invention.

Referring now to FIG. 6 is a cross-sectional view showing a conductive material deposited across a semiconductor device over gate structures on a substrate is depicted according to an embodiment of the present invention.

The contact vias 130 are filled with a contact material 134 to contact the contacts 106 and gate conductors 112 exposed by the contact vias 130. As a result, the contact material 134 fills down to the exposed contacts 106 and gate conductors 112 to form an interface with the material of the exposed contacts 106 and gate conductors 112. To form the interface, the contact material 134 can be bulk filled over the semiconductor device 100 using, e.g., a deposition process, such as, CVD.

The contact material 134 can include, e.g., conductive materials such as, e.g., metals including tungsten (W), copper (Cu), aluminum (Al), silver (Ag), gold (Au), and alloys thereof, as well as other conductive materials including doped semiconductors. In one embodiment, both the contact material 134 and material of the contacts 106 and the gate conductors 112 include a metal such that the contact material 134 forms a metal-to-metal (MTM) interface with the exposed contacts 106 and gate conductors 112 without a liner at the interface. Thus, resistance between the contact material 134 and contacts 106 and gate conductors 112 can be reduced for more efficient operation and better performance.

Figure 7:
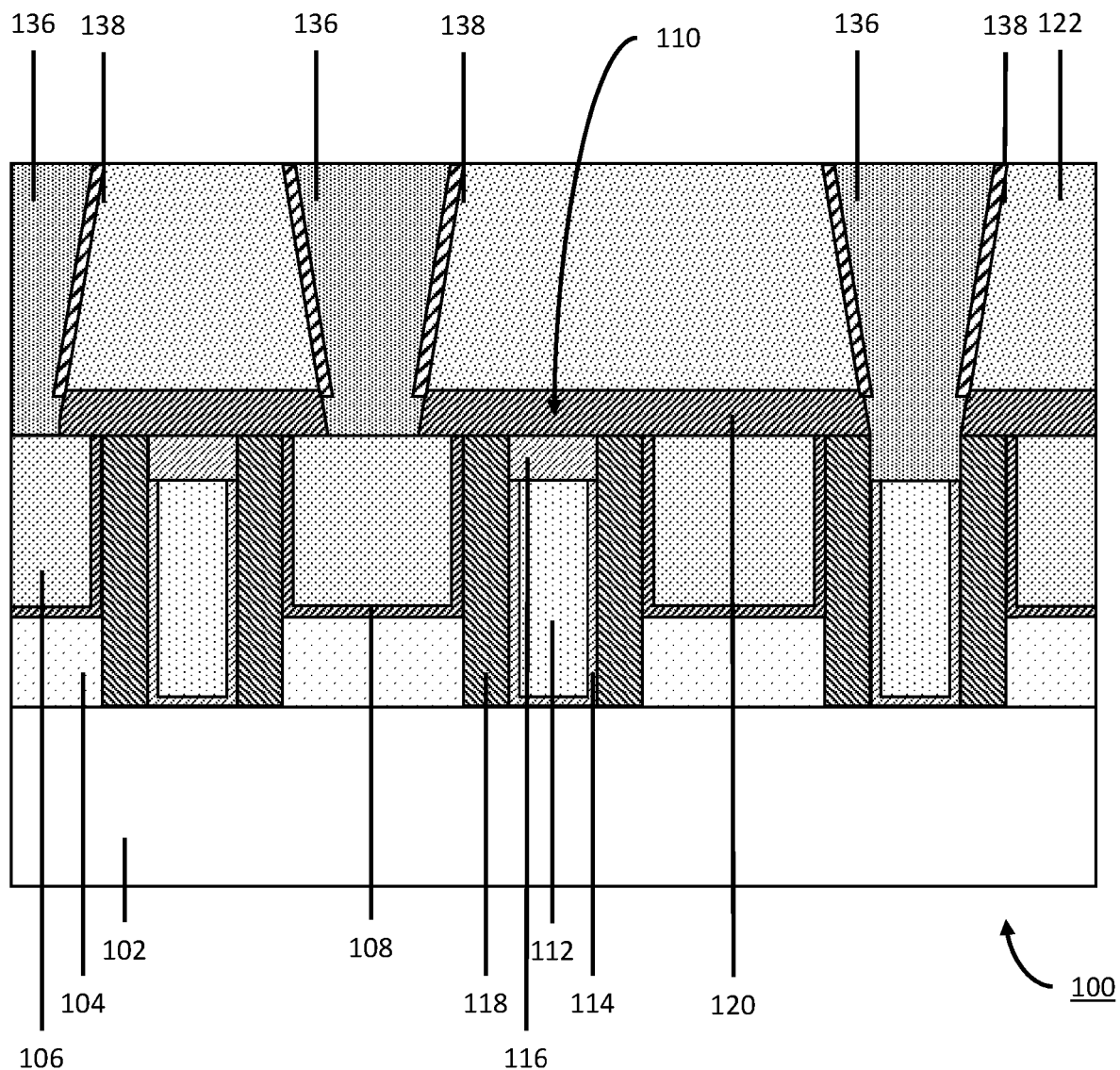
FIG. 7 is a cross-sectional view showing a conductive material, sacrificial layer and hard mask planarized to form stacked contacts over a semiconductor device with gate structures on a substrate, in accordance with an embodiment of the present invention.

Referring now to FIG. 7 is a cross-sectional view showing a conductive material, sacrificial layer and hard mask planarized to form stacked contacts over a semiconductor device with gate structures on a substrate is depicted according to an embodiment of the present invention.

The sacrificial layer 122 is re-exposed by recessing the contact material 134 and the hard mask 124 over the sacrificial layer 122. The contact material 134 and the hard mask 124 can be recessed using, e.g., a planarization, polishing or grinding step to provide a planar top surface of the sacrificial layer 122 with stacked contacts 136 formed therein at the locations of the contact vias described above. According to one possible embodiment, contact material 134 and the hard mask 124 can be recessed using, e.g., chemical mechanical planarization (CMP) to planarize material down to a planar surface of the sacrificial layer 122. As a result, stacked contacts 136 are formed within the sacrificial layer 122 over the semiconductor device 100 with MTM interfaces with contacts 106 and gate conductors 112.

Figure 8:
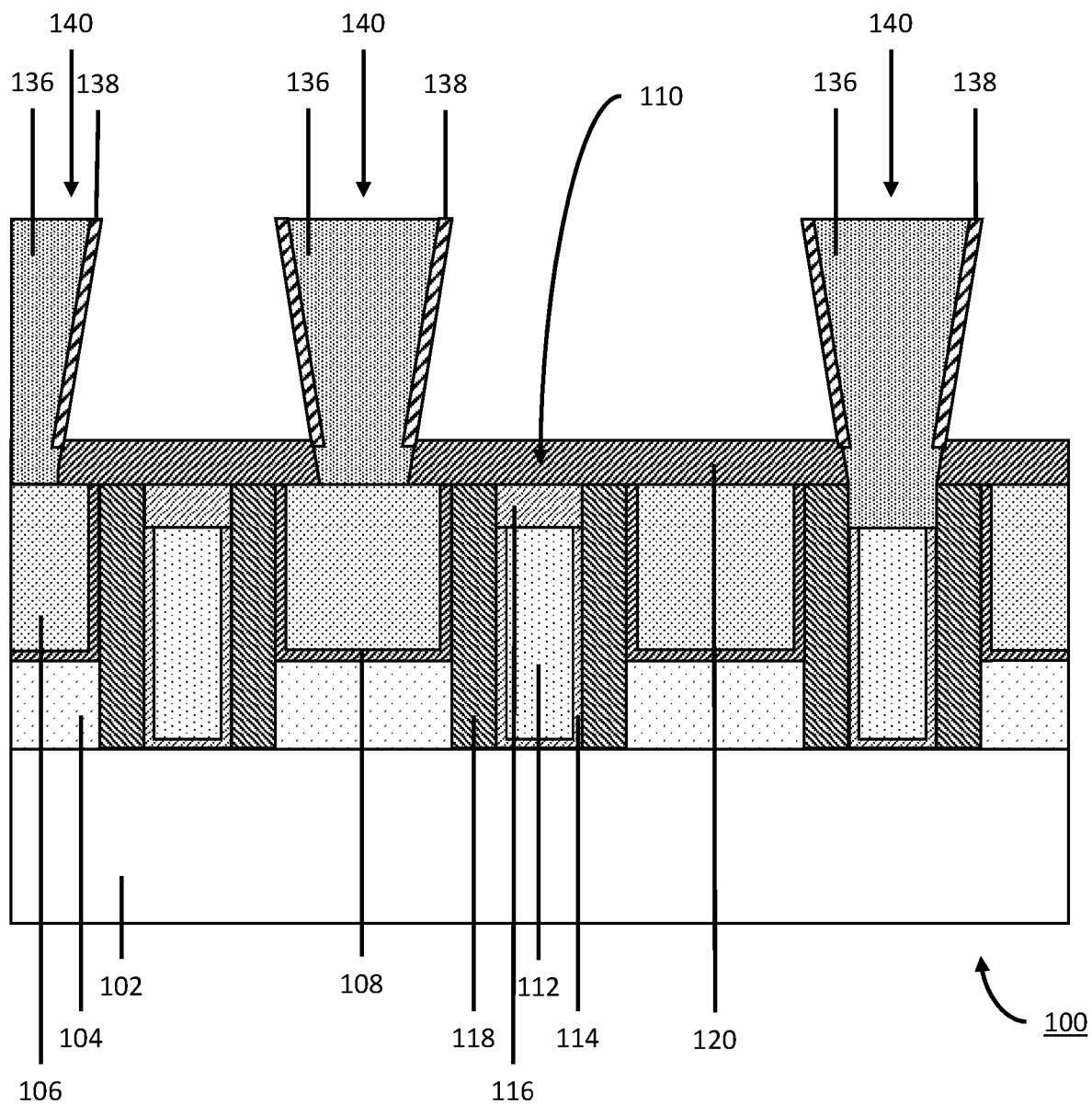
FIG. 8 is a cross-sectional view showing stacked contacts with a sacrificial layer removed over a semiconductor device with gate structures on a substrate, in accordance with an embodiment of the present invention.

Referring now to FIG. 8 is a cross-sectional view showing stacked contacts with a sacrificial layer removed over a semiconductor device with gate structures on a substrate is depicted according to an embodiment of the present invention.

The sacrificial layer 122 is removed from over the semiconductor device 100 to leave stacked contact structures 140 formed on selected contacts 106 and gate conductors 112. The stacked contact structures 140 include, e.g., the stacked contacts 136 as well as barriers 138 formed previously on the sides of the contact vias 130.

The sacrificial layer 122 is removed using, e.g., a selective etch process, including, e.g., an isotropic etch process such as a wet chemical etch or a dry etch. For example, the etchant may be a corrosive liquid or a chemically active ionized gas, such as a plasma. However, an anisotropic etch process, such as, e.g., RIE, is also contemplated. The etch chemistry removes the sacrificial layer 122 selective to the barrier 138, the stacked contacts 136 and the capping layer(s) 120, as well as any other exposed materials, to remove the sacrificial layer 122.

As a result, the barrier 138 remains on the sides of the stacked contacts 136 to form liners 138 for each of the stacked contacts 136. Therefore, the stacked contact structures 140 include the barriers 138 to better isolate stacked contacts 136.

Figure 9:
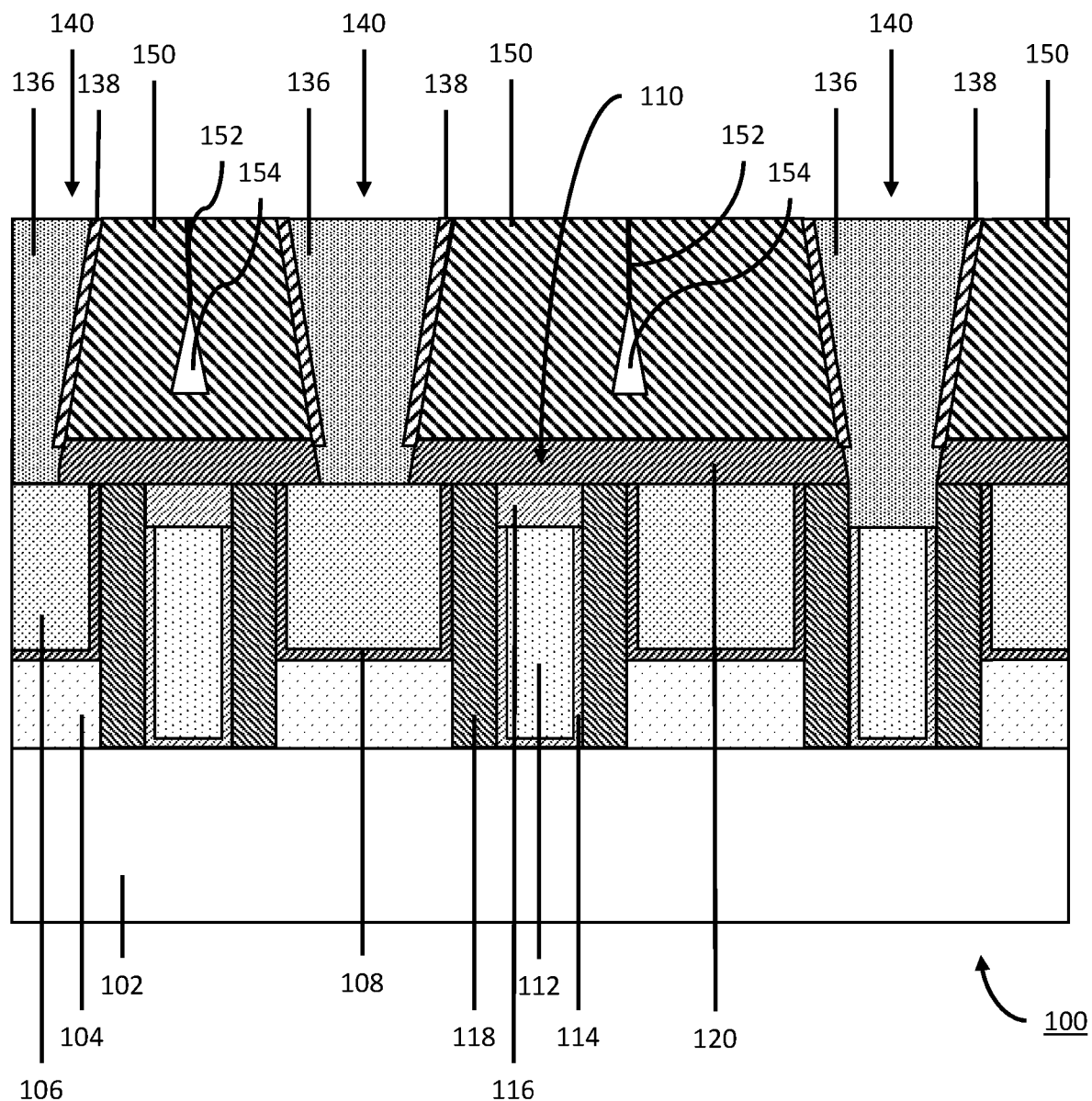
FIG. 9 is a cross-sectional view showing an isolation material with air-gaps between stacked contacts over a semiconductor device with gate structures on a substrate, in accordance with an embodiment of the present invention.

Referring now to FIG. 9 is a cross-sectional view showing an isolation material with air-gaps between stacked contacts over a semiconductor device with gate structures on a substrate is depicted according to an embodiment of the present invention.

According to an embodiment of the present invention, the stacked contact structures 140 are further isolated from each other with an interlevel dielectric layer (ILD) 150 having air-gaps 154 formed therein. The ILD 150 is formed by conformally depositing a dielectric material across the semiconductor device 100 using, e.g., ALD. As a result, the dielectric material extends outwards from each of the stacked contact structures 140 and from the capping layer(s) 120 through continued deposition. According to one embodiment, deposition of the dielectric material is continued until the dielectric material extends from sides of the stacked contact structures 140 such that dielectric material on sides of adjacent stacked contact structures 140 meet and form a seam 152.

According to one embodiment, the sides of the stacked contact structures 140 are sloped such that a top surface of the stacked contact structures 140 opposite the semiconductor device 100 is wider than a bottom surface adjacent the semiconductor device 100. Thus, the top surfaces of the stacked contact structures 140 are separated by less space between adjacent stacked contact structures than the bottom portions. As a result, conformal deposition of the ILD 150 leads to a top portion of the ILD 150 proximal to the top surface of the stacked contact structures 140 opposite to the semiconductor device 100 closing off before a lower portion beneath the top portion. As a result, the seam 152 forms at the top portion, closing off an air-gap 154 in the lower portion beneath the seam 152. As a result, air-gaps 154 are formed between adjacent stacked contact structures 140 to improve isolation between each of the stacked contact structures.

Following deposition of the dielectric material for the ILD 150, a planarization processes is conducted to provide an upper surface, wherein the upper surface of the ILD 150 is coplanar with the upper surface of the stacked contact structures 140. The planarization of the ILD 150 may be provided by chemical mechanical planarization.

The ILD 150 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 150 include any of the aforementioned materials in porous form, or in a form that changes during processing to or from being porous and/or permeable to being non-porous and/or non-permeable.

Figure 10:
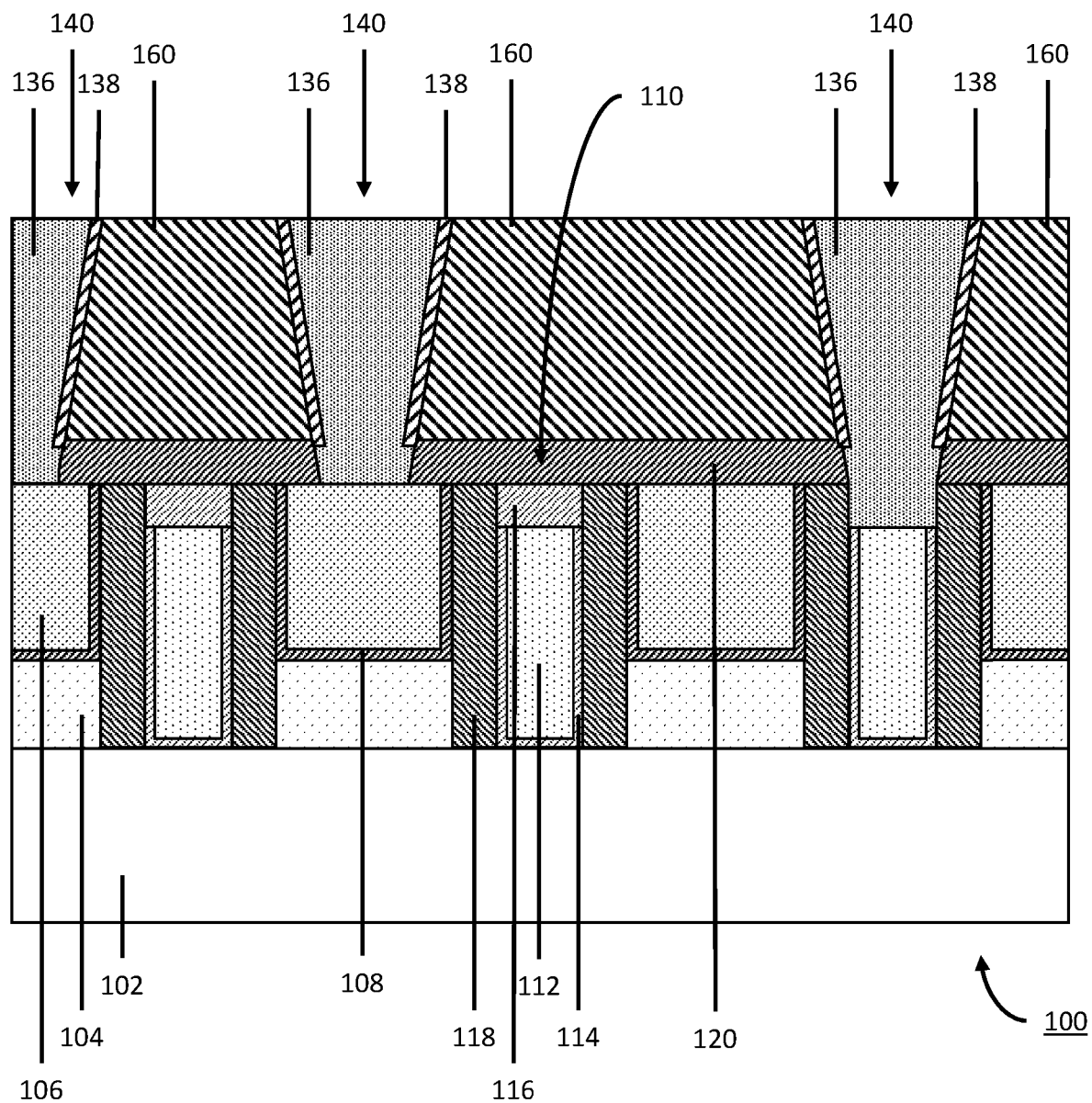
FIG. 10 is a cross-sectional view showing an isolation material between stacked contacts over a semiconductor device with gate structures on a substrate, in accordance with an embodiment of the present invention.

Referring now to FIG. 10 is a cross-sectional view showing an isolation material between stacked contacts over a semiconductor device with gate structures on a substrate is depicted according to an embodiment of the present invention.

According to an embodiment of the present invention, the stacked contact structures 140 are further isolated from each other with an interlevel dielectric layer (ILD) 160. The ILD 160 may be deposited using at least one of spinning from solution, spraying from solution, chemical vapor deposition (CVD), plasma enhanced CVD (PECVD), sputter deposition, reactive sputter deposition, ion-beam deposition, and evaporation. Following deposition of the dielectric material for the ILD 160, a planarization processes is conducted to provide an upper surface, wherein the upper surface of the ILD 160 is coplanar with the upper surface of the stacked contact structures 140. The planarization of the ILD 160 may be provided by chemical mechanical planarization.

Figure 11:
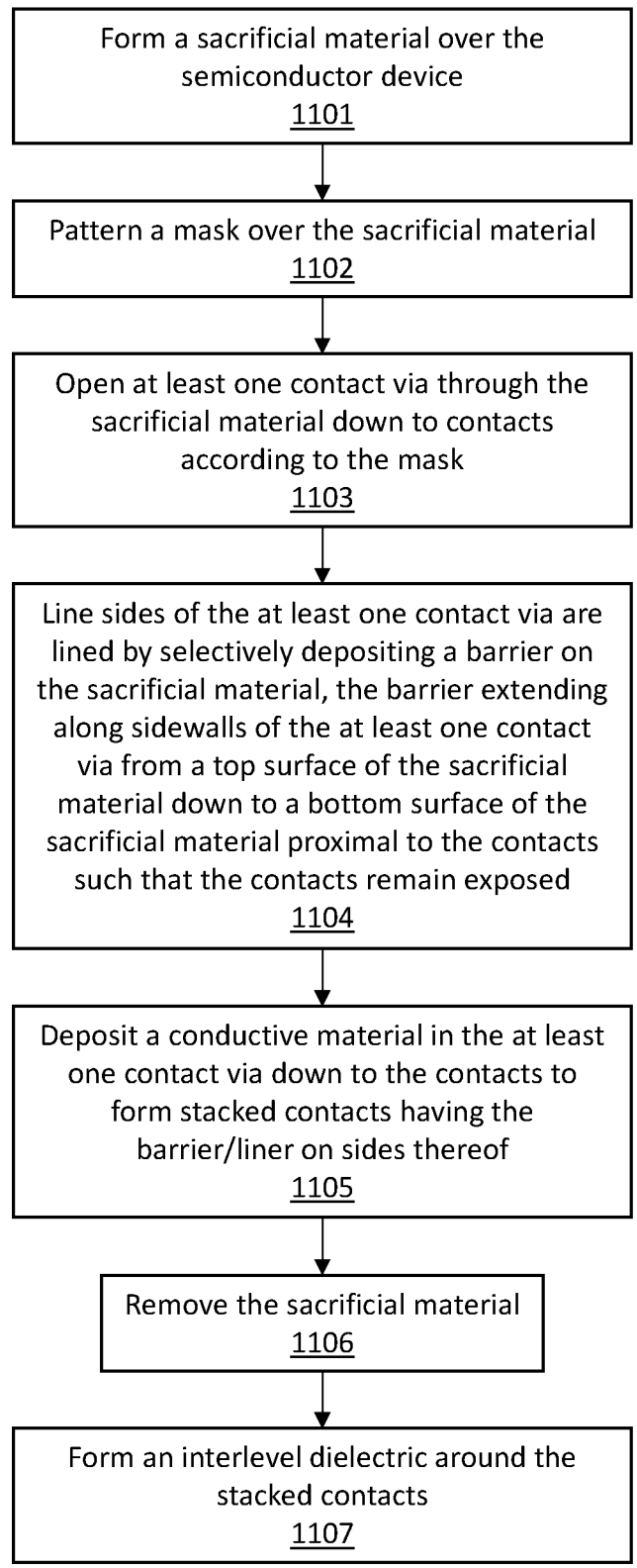
FIG. 11 is a block/flow diagram showing a system/method for forming a semiconductor device with linerless stacked contacts, in accordance with an embodiment of the present invention.

Referring now to FIG. 11, a block/flow diagram showing a system/method for forming a semiconductor device with linerless stacked contacts is depicted according to an embodiment of the present invention.

At block 1101, form a sacrificial material over the semiconductor device.

At block 1102, pattern a mask over the sacrificial material.

At block 1103, open at least one contact via through the sacrificial material down to contacts according to the mask.

At block 1104, line sides of the at least one contact via are lined by selectively depositing a barrier on the sacrificial material, the barrier extending along sidewalls of the at least one contact via from a top surface of the sacrificial material down to a bottom surface of the sacrificial material proximal to the contacts such that the contacts remain exposed.

At block 1105, deposit a conductive material in the at least one contact via down to the contacts to form stacked contacts having the barrier on sides thereof.

At block 1106, remove the sacrificial material.

At block 1107, form an interlevel dielectric around the stacked contacts.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device with stacked contacts, the semiconductor device comprising:
    a device layer with device components, the device components including:
        a gate structure including a gate conductor disposed on a substrate;
        a source/drain region on each of opposing sides of the gate structure;
        a trench contact contacting each of the source/drain regions;
        a contact material in metal-to-metal contact with the trench contact; and
        airgaps disposed above a topmost surface of the gate structure.

2. The semiconductor device of claim 1, further comprising a sacrificial layer on the device layer, and a barrier layer on sidewalls of a via through the sacrificial layer, wherein the barrier layer separates the contact material is from the sacrificial layer.

3. The semiconductor device of claim 2, further comprising a dielectric capping layer between the sacrificial layer and the device layer.

4. The semiconductor device of claim 3, wherein the dielectric capping layer is made of a dielectric material selected from the group consisting of silicon nitride (SiN) and silicon dioxide ($SiO_2$).

5. The semiconductor device of claim 3, wherein at least a portion of the dielectric capping layer is in direct contact with the contact material.

6. The semiconductor device of claim 5, further comprising a spacer between the source/drain region and gate structure.

7. The semiconductor device of claim 5, wherein the barrier layer is made of titanium nitride (TiN).

8. A semiconductor device, comprising:
    a source/drain region on a substrate;
    a trench contact on the source/drain region;
    a contact material in metal-to-metal contact with the trench contact;
    a barrier layer on a portion of the contact material; and airgaps disposed above a topmost surface of the trench contact.

9. The semiconductor device as recited in claim 1, wherein the trench contact is a conductive metal selected from the group consisting of tungsten, titanium, tantalum, ruthenium, cobalt, and platinum.

10. The semiconductor device of claim 9, wherein the contact material is a conductive metal selected from the group consisting of copper (Cu), aluminum (Al), silver (Ag), and gold (Au).

11. The semiconductor device of claim 10, wherein the barrier layer is made of titanium nitride (TiN).

12. The semiconductor device of claim 11, further including a dielectric capping layer on a portion of the trench contact, and a sacrificial layer on the dielectric capping layer.

13. The semiconductor device of claim 12, wherein the barrier layer is a conformal layer between the sacrificial layer and the contact material.

14. A semiconductor device with stacked contacts, the semiconductor device comprising:
   a device layer with device components, the device components including:
      a gate structure disposed on a substrate including a gate conductor;
      a source/drain region on each of opposing sides of the gate structure;
      a trench contact contacting each of the source/drain regions;
      airgaps disposed above a topmost surface of the gate structure; and
      a stacked contact layer including at least one stacked contact in metal-to-metal contact with at least one of the device components and having a barrier on sides of the at least one stacked contact.

15. The semiconductor device of claim 14, further including an interlevel dielectric around the at least one stacked contact in the stacked contact layer.

16. The semiconductor device as recited in claim 15, further including a dielectric layer between the semiconductor device and the interlevel dielectric, wherein the barrier is disposed between the sides of the at least one stacked contact and the interlevel dielectric selective to the dielectric layer.

17. The semiconductor device of claim 16, wherein the barrier includes a nitride.

18. The semiconductor device of claim 17, wherein the air gaps are formed within an interlevel dielectric between each of the at least one stacked contact.

\* \* \* \* \*